(12) United States Patent
Cave et al.

(10) Patent No.: US 7,592,677 B2
(45) Date of Patent: *Sep. 22, 2009

(54) OVER-VOLTAGE PROTECTED SEMICONDUCTOR DEVICE AND FABRICATION

(76) Inventors: David Cave, 2162 E. La Vieve, Tempe, AZ (US) 85284; Jade H Alberkrack, 1834 E. Calle de Caballos, Tempe, AZ (US) 85284

( * ) Notice: Subject to any disclaimer, the term of this patent is extended or adjusted under 35 U.S.C. 154(b) by 444 days.

This patent is subject to a terminal disclaimer.

(21) Appl. No.: 11/484,879

(22) Filed: Jul. 11, 2006

(65) Prior Publication Data

US 2008/0012039 A1    Jan. 17, 2008

(51) Int. Cl.
  H01L 29/76   (2006.01)
  H01L 29/94   (2006.01)
  H01L 31/062  (2006.01)
  H01L 31/113  (2006.01)
  H01L 31/119  (2006.01)
(52) U.S. Cl. ........................................... 257/392
(58) Field of Classification Search ............... 257/392
  See application file for complete search history.

(56) References Cited

U.S. PATENT DOCUMENTS 4,893,158 A    1/1990    Mihara et al.
6,924,532 B2   8/2005    Pfirsch et al.
2007/0224710 A1 *  9/2007  Palacios et al. ............... 438/12
2007/0278597 A1 * 12/2007  Shen et al. .................. 257/392
2008/0013229 A1 *  1/2008  Alberkrack et al. ........... 361/56
2008/0050876 A1    2/2008  Matocha et al.

OTHER PUBLICATIONS

Hsu,, Heng-Ming, et al., "Integrated power transistor in 0.18 um CMOS technology for RF system-on-chip applications", IEEE Trans. Microw Ther & Tech, Dec. 2002, vol. 50 No. 12, p. 2873-81.*

* cited by examiner

Primary Examiner—Howard Weiss
(74) Attorney, Agent, or Firm—Knobbe Martens Olson & Bear LLP

(57) ABSTRACT

In accordance with the principles of the invention, a semiconductor substrate is provided that has a first cell formed thereon. The first cell has first and second terminals or nodes and a control terminal or node and has a characteristic breakdown voltage across the first and second terminals. A voltage sensing transistor is coupled across the power transistor first and second terminals. The voltage sensing transistor has a second element characteristic breakdown voltage that is less than the first cell characteristic breakdown voltage. The voltage sensing transistor provides a control signal to the terminal when the voltage across the first and second terminals exceeds the second element characteristic breakdown voltage.

31 Claims, 6 Drawing Sheets

OVER-VOLTAGE PROTECTED SEMICONDUCTOR DEVICE AND FABRICATION

CROSS-REFERENCE TO RELATED APPLICATIONS

This application is related to application Ser. No. 11/484,869, now U.S. Pat. No. 7,468,873, filed on even date herewith and assigned to a common assignee.

FIELD OF THE INVENTION

The invention pertains to semiconductor devices, in general, and to providing over-voltage protection to semiconductor devices, in particular.

BACKGROUND OF THE INVENTION

Inductive loads switched by a power transistor can produce voltages high enough so that without over-voltage protection, the power transistor may be permanently damaged.

In the past, one way of providing protection for power MOSFETs has been utilizing a feedback path comprising a series connected zener diode and a conventional diode connected across the gate-drain of the MOSFET as shown in FIG. 1.

To protect against over-voltage, the zener voltage Vz plus the diode drop voltage Vd plus the MOSFET gate to source voltage Vgs must be less than the MOSFET breakdown voltage. As a practical matter, the total voltage drop of Vz+Vd+Vgs must be much less than the MOSFET breakdown voltage due to the fact that these elements do not track fabrication process variations in the devices.

It is desirable to provide a power transistor device that has over-voltage protection integral to the device.

SUMMARY OF THE INVENTION

In accordance with the principles of the invention, a semiconductor device is provided that comprises a substrate that has a first circuit cell formed thereon and a voltage sensing cell also formed on the substrate. The first circuit cell has first and second nodes and has a first characteristic breakdown voltage across the first and second nodes. The first characteristic breakdown voltage is determined by the geometric layout of the first circuit cell. The voltage sensing cell comprises a transistor coupled across the first and second nodes and has a second element characteristic breakdown voltage. The sensing transistor has a geometric layout such that the second element characteristic breakdown voltage is determined by a second layout distance of the sense transistor.

When the voltage across the first circuit cell first and second terminals reaches the characteristic second element breakdown voltage, the voltage sensing transistor turns on and, in turn causes the first circuit cell to turn on protecting the first circuit cell from any increase in voltage.

The illustrative embodiment of the invention is a semiconductor device comprising a substrate having a power transistor formed thereon. The power transistor comprises first and second terminals and a control terminal and has a characteristic first breakdown voltage across the first and said second terminals. The power transistor has a geometric layout such that the characteristic first breakdown voltage is determined by a first layout distance of the power transistor. The semiconductor device also comprises a voltage sensing transistor formed on the substrate. The voltage sensing transistor is coupled across the first and second terminals and has a second element characteristic breakdown voltage that is less than the characteristic first breakdown voltage. The sensing transistor has a geometric layout such that the second element characteristic breakdown voltage is determined by a second layout distance of the sense transistor.

In accordance with an aspect of the invention the power transistor and the voltage sensing transistor are concurrently fabricated on the substrate. The power transistor is laid out on said substrate to have the characteristic first breakdown voltage, and the voltage sensing transistor is laid out on the substrate to have the second element characteristic breakdown voltage.

In the illustrative embodiment of the invention the power transistor comprises at least one MOSFET power transistor first cell having a source, a drain and a gate. The MOSFET power transistor first cell has a first drain to source characteristic breakdown voltage. The voltage sensing transistor comprises a MOSFET transistor second cell having a source, a drain connected in common with the MOSFET power transistor first cell drain, and a gate connected in common with the MOSFET power transistor first cell gate. The MOSFET transistor second cell is designed to have a drain-source characteristic breakdown voltage, also referred to herein as a characteristic second element breakdown voltage, that is less than the first characteristic breakdown voltage. The difference in breakdown voltages is determined by the geometric layout of the cells.

In the illustrative embodiment of the invention, the power transistor comprises at least a second MOSFET power transistor first cell that is substantially identical to the at least one MOSFET power transistor first cell.

BRIEF DESCRIPTION OF THE DRAWING

The invention will be better understood from a reading of the following detailed description of the drawing figures in which like reference designations are utilized to identify like elements, and in which.

DETAILED DESCRIPTION

To obtain higher current switching capability, power transistors may be comprised of a plurality of individual power transistor cells fabricated on a substrate and connected in parallel.

Figure 2:
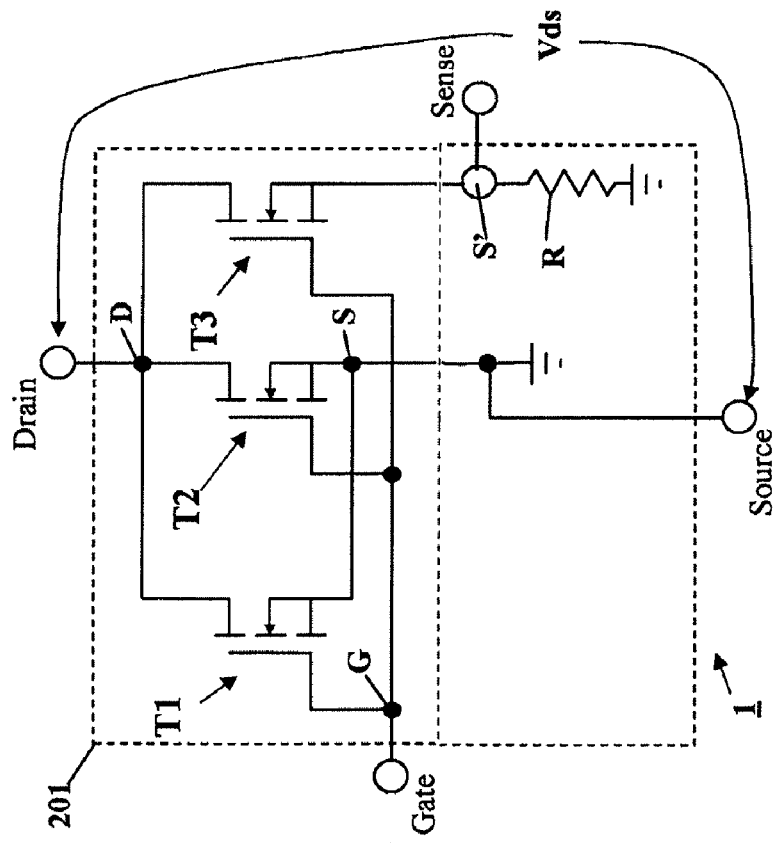
FIG. 2 illustrates a MOSFET arrangement in accordance with the principles of the invention.

Turning now to one illustrative embodiment of the invention shown in FIG. 2, MOSFET power transistor structure 1 is fabricated on a single substrate 201. The power transistor structure 1 includes two MOSFET power transistor cells T1, T2 fabricated on the single substrate 201. Transistor cells T1, T2 have their respective gates, drains and sources connected in common to gate node G, drain node D, and source node S, respectively. Each of transistor cells T1, T2 has a first characteristic drain-source voltage Vds which is a characteristic breakdown voltage that is dependent on several factors, including but not limited to the layout of the transistors on the substrate 201. The layout of both transistor cells T1, T2 is identical and the characteristic drain-source breakdown voltages of both cells are the same.

Although two transistor cells are shown, it will be appreciated by those skilled in the art that the power transistor structure may have fewer or more transistor cells.

In addition to the two power transistor cells T1, T2, power transistor structure 1 includes a breakdown voltage sensing transistor cell T3 is formed on substrate 201. Transistor cell T3 is fabricated at the same time as transistor cells T1, T2 but is designed to have a drain source characteristic breakdown voltage Vds that is less than the drain-source characteristic breakdown voltage of the power transistor formed by transistor cells T1, T2. Voltage sensing transistor cell T3 has its drain and gate connected to the drain D and gate G, respectively, of transistor cells T1, T2. The source terminal of transistor cell T3 is coupled to a current limiting device or resistor. In the illustrative embodiment of the invention, resistor R is formed on the same substrate 201, but may in some embodiments be separate from substrate 201.

In operation, when the drain-source voltage Vds across transistor cells T1, T2 reaches the second element characteristic breakdown voltage of sensing transistor cell T3, transistor cell T3 conducts current. The current through transistor T3 is limited by resistor R which prevents damage to transistor cell T3. A voltage is produced across resistor R at sense terminal S'. The voltage at sense terminal S' may be utilized to control the gate of the power transistor formed by transistor cells T1, T2 such that the combined power transistor device formed on substrate 201 makes power transistor 1 self-protecting against breakdown voltages applied across its switching path.

The drain-source breakdown voltage of sense transistor cell T3 tracks the drain-source power transistor cells T1, T2 over process variations since it is an integral part of the power transistor structure 1.

In the illustrative embodiment shown in FIG. 2, transistor cells T1, T2, T3 are N-channel MOSFET structures. As will be appreciated by those skilled in the art, the principles of the invention may also be utilized with other transistor structures including P-channel MOSFET, N- and P-channel IGBTs, as well as NPN and PNP transistors.

Figure 3:
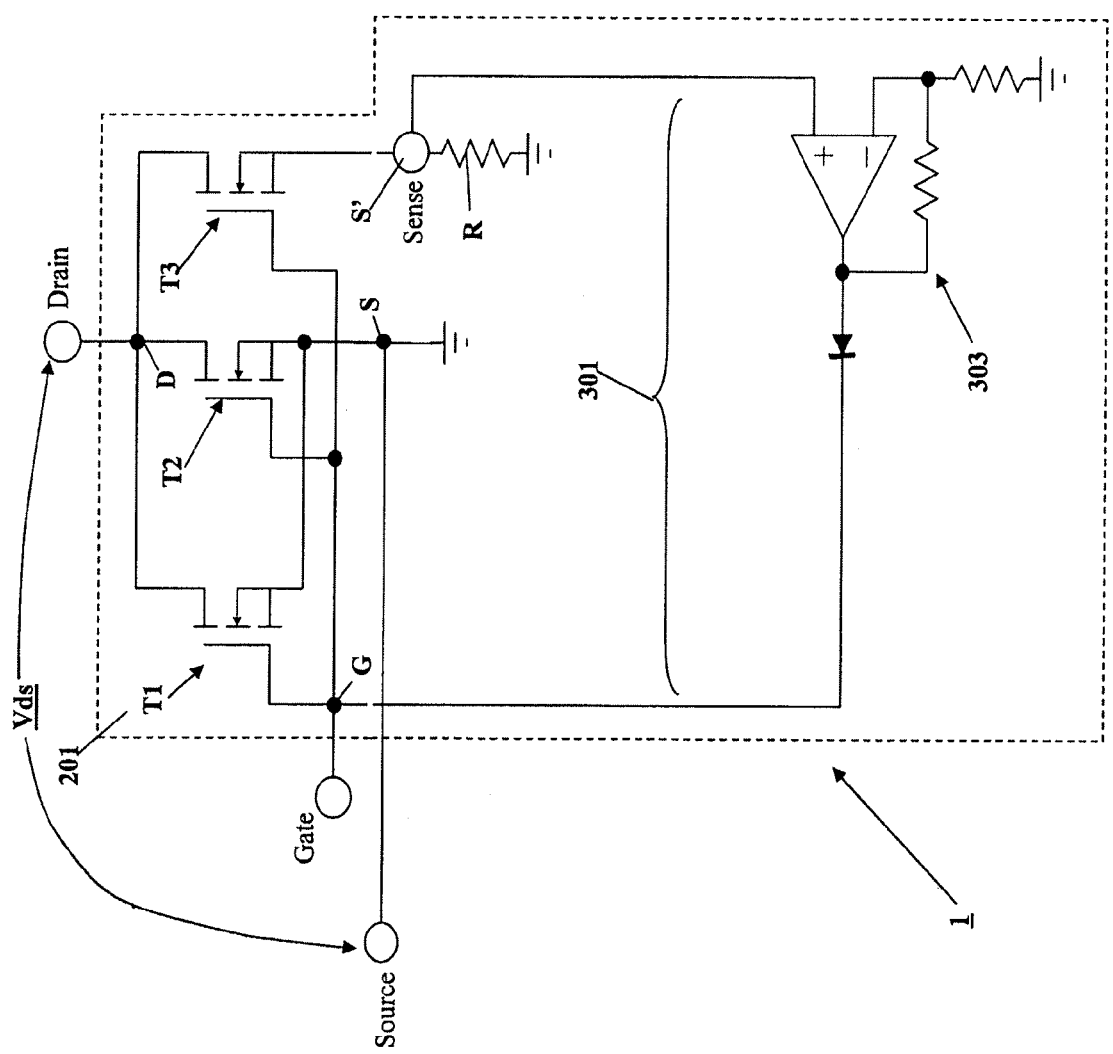
FIG. 3 illustrates a second MOSFET arrangement in accordance with the principles of the invention.

Turning now to FIG. 3, a feedback circuit or path 301 is provided from the sense transistor cell T3 to the control or gate input G of the power transistor structure 1. Feedback circuit or path 301 includes an amplifier circuit 303. As the voltage across sensing element or transistor cell T3 reaches the second element characteristic breakdown voltage, sensing element or transistor cell T3 produces a voltage at sense terminal or node S', amplifier 303 provides an output level at control input or gate G of the power transistor structure 1 to turn on the power transistor cells T1, T2 and sense cell T3 thus providing protection by limiting the applied drain voltage to less than the breakdown voltage of cells T1, T2.

The specific structure of amplifier 303 may be any one of a number of known feedback amplifiers. In addition a gate circuit may also be included to assure that the power transistor structure 1 does not turn on as power is applied.

In the illustrative embodiments of the over-voltage protected structures, the breakdown voltage sensing cell or element T3 is shown with a common drain to the power MOSFET cells or elements T1, T2, and the sense output is derived from the source of the over-voltage sensing element T3. In other embodiments, the voltage sensing element source is in common with the sources of the power MOSFET elements, and the sense output is derived from the drain of the breakdown voltage sensing element.

Figure 1:
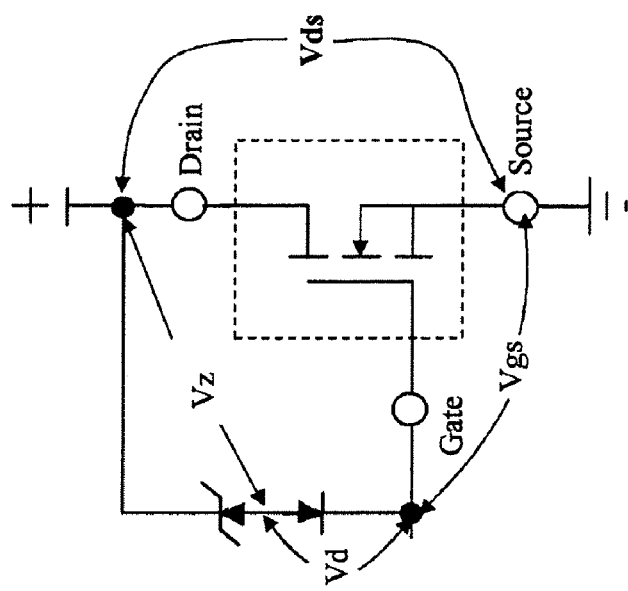
FIG. 1 illustrates a prior art arrangement for protection of a power MOSFET device.

Monolithic power devices such as structure 1 shown in FIGS. 1-3 are generally comprised of a plurality of identical smaller cells such as transistor cells T1, T2.

As shown and described above one or more sense cells or transistors T3 embedded in an integrated multi-celled power device 1 are used to sense that the main power device is nearing breakdown its characteristic breakdown voltage. Each sense cell T3 is configured to have a predefined breakdown voltage that is lower and tracks the breakdown voltage of the main power device 1.

In many types of semiconductor devices, for example CMOS and lateral diffused MOS (LDMOS), the geometric design layout of the device is one parameter that determines breakdown voltage.

In accordance with the principles of the invention a power device comprises a plurality of identical cells T1, T2, T3. One or more of the cells is designated as sense cell T1. The physical dimensions of the sense cell are modified from that of the other cells.

Figure 4:
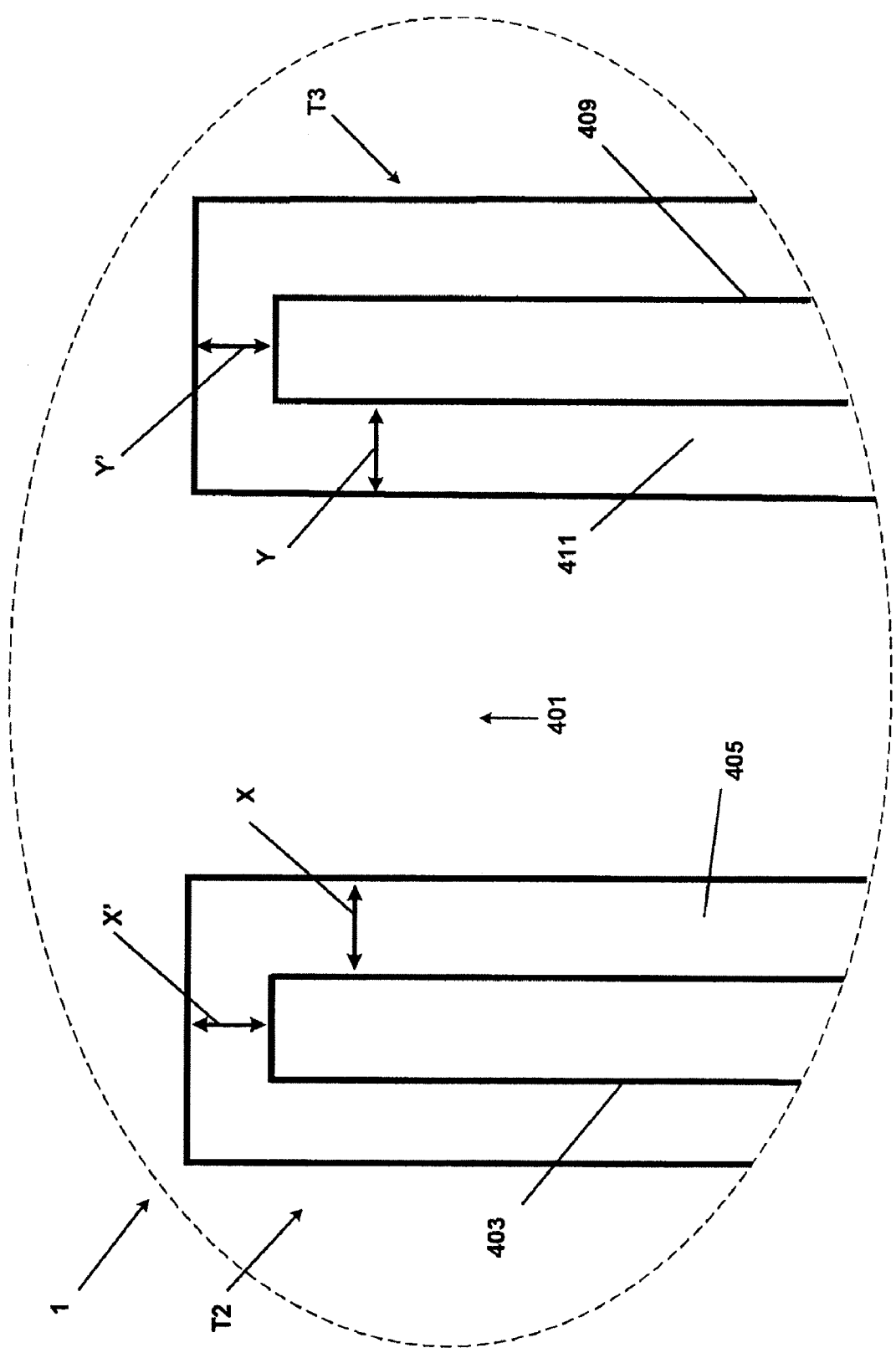
FIG. 4 is a cross-section of one FET arrangement in accordance with the principles of the invention.
Figure 5:
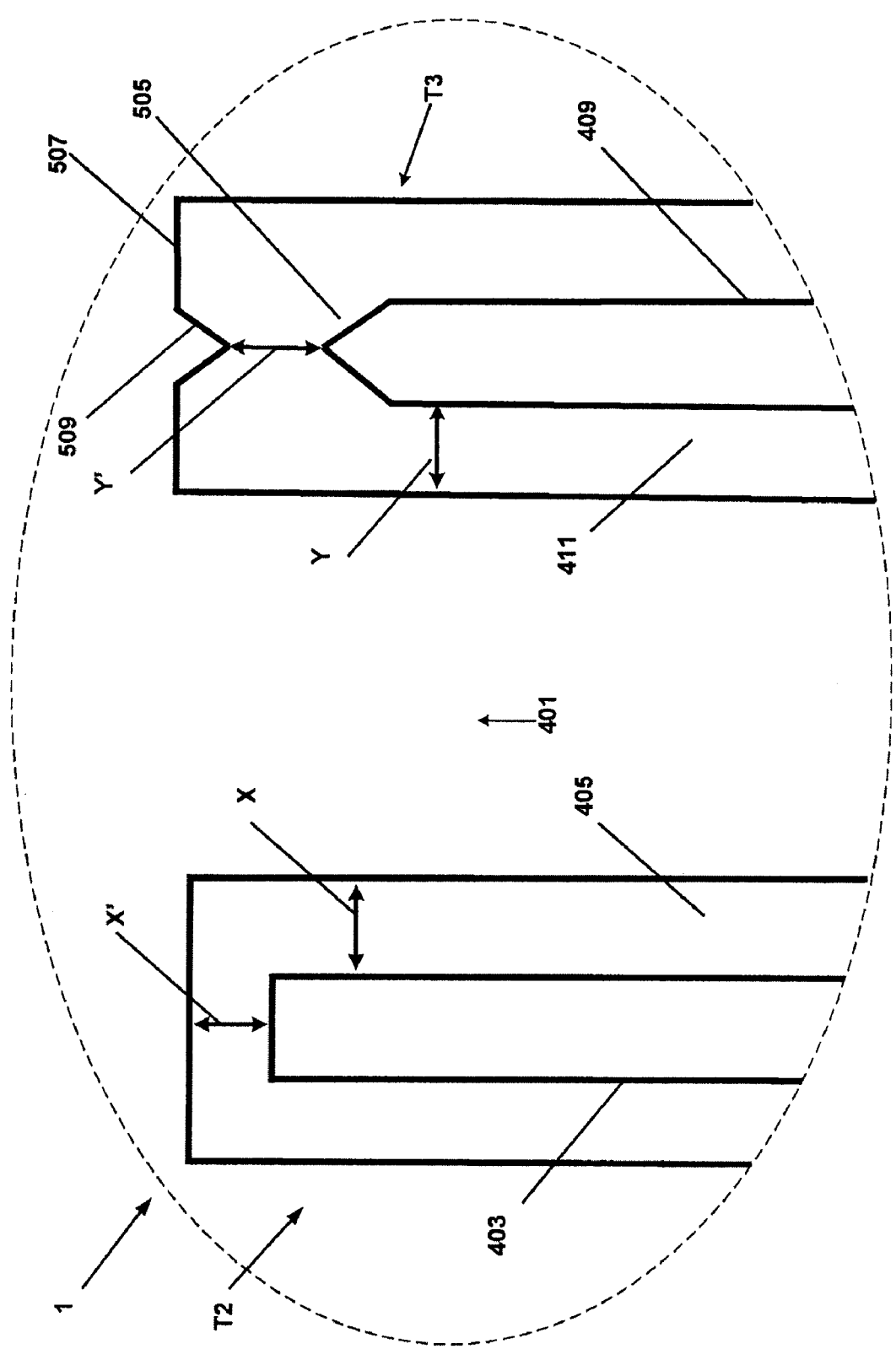
FIG. 5 is a cross-section of another FET arrangement in accordance with the principles of the invention.

Turning now to FIGS. 4-7, the geometric design layouts of various monolithic power devices 1 including a sense element T3 are shown. Each of the planar layouts of FIGS. 4 and 5 shows a portion of a substrate on which FET transistor cells are formed. Power transistor cell T2 has a source finger 403. Sense cell transistor has a source finger 409. Both transistors T2, T3 utilize the substrate to form a drain 401. Transistor T2 includes a metallization layer 405 as a gate and transistor T3 includes a metallization layer 411 as its gate. The geometric layout of transistors T2, T3 determines the respective source-drain breakdown voltages. Transistor T2 has a characteristic source drain breakdown voltage that is determined, in part, by the distances X and X' between finger 403 and the drain or substrate 401. Transistor cell T3 has a second element source-drain characteristic breakdown voltage that is determined by the distances Y and Y.' At least one of the distances Y and Y' is less than the corresponding distance X and X', respectively. The smaller the distance Y is than X, or Y' is than X', the lower the characteristic breakdown voltage of Transistor cell T3 is compared to the characteristic breakdown voltage of Transistor cell T2.

Figure 6:
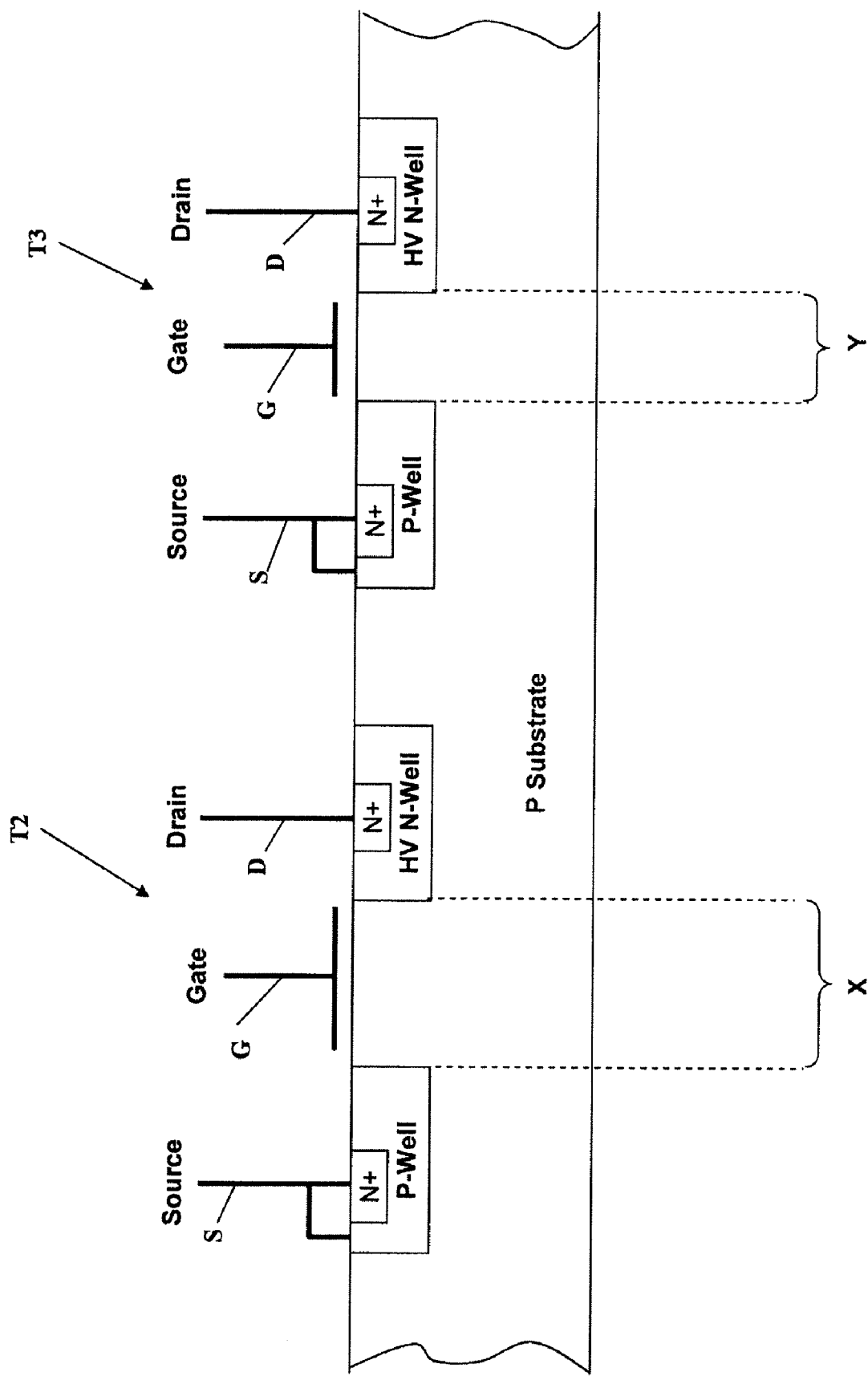
FIG. 6 is a top planar view of a lateral diffused MOS FET arrangement in accordance with the principles of the invention.
Figure 7:
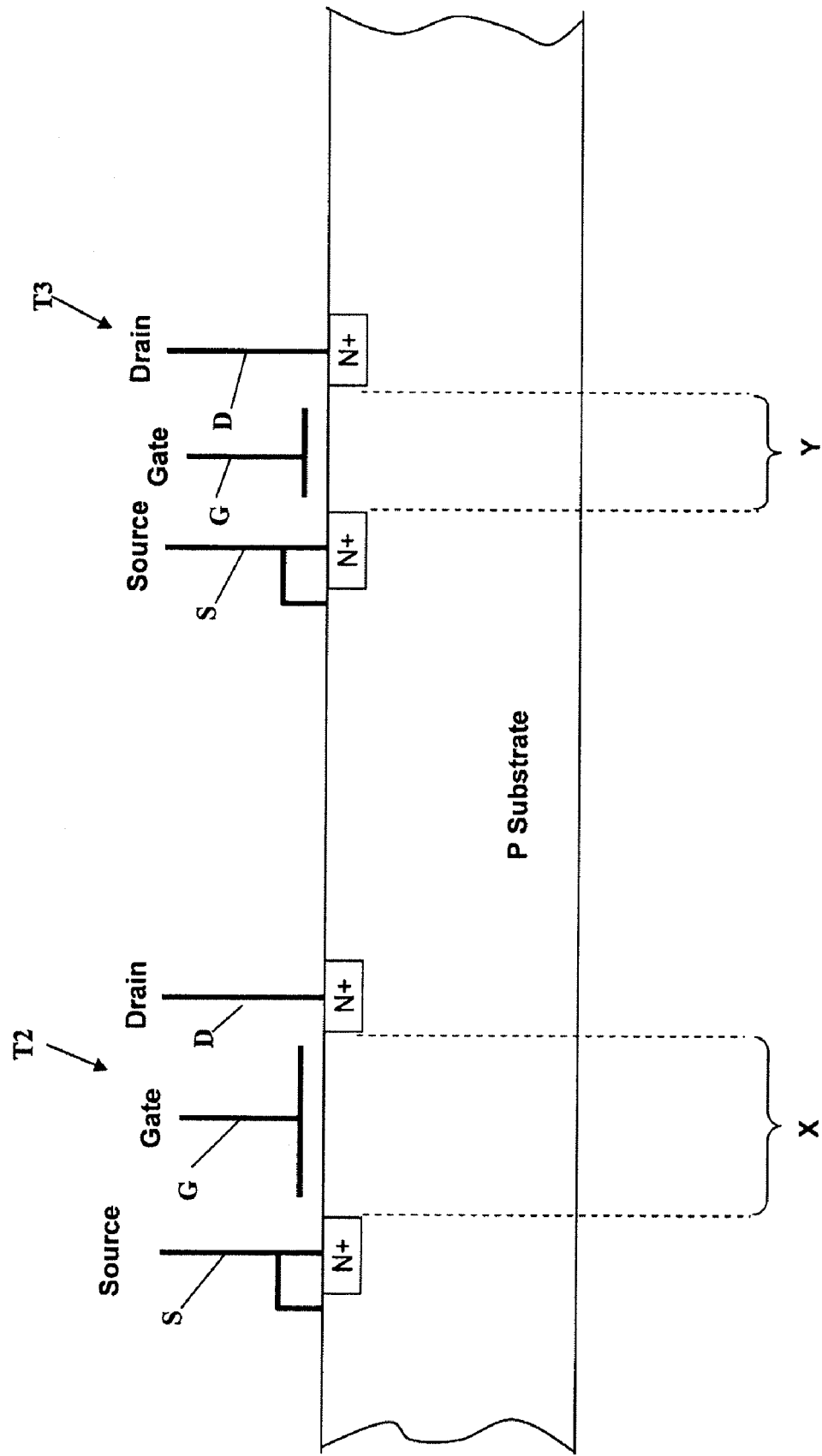
FIG. 7 is a top planar view of another MOS FET arrangement in accordance with the principles of the invention.

FIGS. 6 and 7 illustrate different LDMOS and MOS devices each having at least one power cell transistor T2 and a sense cell transistor T3. The geometric layout of transistors T2 and T3 again have different distances X and Y between the respective source and drain. Distance Y is chosen to provide a characteristic source-drain breakdown voltage for transistor cell T3 that is less than the characteristic source-drain breakdown voltage of transistor cell T2.

FIG. 5 shows another geometric layout of a sense transistor T3 in which the source finger 409 terminates in a point 505. The corresponding end surface 507 of drain 401 includes a point 509 disposed opposite point 505. The opposing points 505, 509 define a distance Y' that is less than the corresponding distance X' of transistor cell T2. The distance Y' determines the characteristic source drain breakdown voltage of transistor cell T3.

The invention has been described in terms of specific embodiments. It will be appreciated by those skilled in the art that various changes and modifications may be made to the embodiments without departing from the spirit or scope of the invention. It is intended that the scope of the invention not be limited to the specific embodiments shown and described, but that the scope of the invention be limited only by the claims appended hereto.

What is claimed is:

1. A semiconductor device, comprising:
   a substrate;
   a power transistor formed on the substrate, wherein the power transistor includes first and second terminals and a control terminal and has a first characteristic breakdown voltage across the first and second terminals, and wherein the power transistor has a first geometric layout such that the first characteristic breakdown voltage is determined by a first layout distance of the power transistor; and
   a voltage-sensing transistor formed on the substrate, wherein the voltage-sensing transistor is coupled across the first and second terminals, wherein the voltage-sensing transistor has a second characteristic breakdown voltage that is less than the first characteristic breakdown voltage, wherein the voltage-sensing transistor has a second geometric layout such that the second characteristic breakdown voltage is determined by a second layout distance of the voltage-sensing transistor, and wherein the voltage-sensing transistor provides a control signal to the power transistor to turn on the power transistor when the voltage across the first and second terminals reaches the second characteristic breakdown voltage.

2. The semiconductor device of claim 1, wherein:
   the power transistor comprises a first field effect transistor ("FET") and the first layout distance is a source-to-drain distance of the first FET; and
   the voltage-sensing transistor comprises a second FET and the second layout distance is a source-to-drain distance of the second FET.

3. The semiconductor device of claim 2, wherein the power transistor further comprises a third FET, and wherein the third FET is geometrically identical to the first FET.

4. The semiconductor device of claim 1, wherein the power transistor further comprises at least a first and a second transistor cell, wherein the first and second transistor cells have substantially identical geometric layouts on the substrate.

5. The semiconductor device of claim 4, wherein the second geometric layout differs from the geometric layouts of the first and second transistor cells such that the second characteristic breakdown voltage is less than a corresponding breakdown voltage of the first and second transistor cells.

6. The semiconductor device of claim 5, wherein the second geometric layout comprises opposing pointed configurations separated by the second layout distance.

7. The semiconductor device of claim 1, wherein the power transistor and the voltage-sensing transistor each comprise metal-oxide-semiconductor ("MOS") devices.

8. The semiconductor device of claim 1, wherein the power transistor and the voltage-sensing transistor each comprise lateral diffused metal-oxide-semiconductor ("LDMOS") devices.

9. A semiconductor device, comprising:
   a substrate;
   a first circuit cell formed on the substrate, wherein the first circuit cell includes first and second nodes and has a first characteristic breakdown voltage across the first and second nodes, and wherein the first characteristic breakdown voltage is determined by a first geometric layout distance of the first circuit cell; and
   a voltage-sensing cell formed on the substrate, wherein the voltage-sensing cell includes a voltage-sensing transistor having first and second nodes coupled across the first and second nodes of the first circuit cell, wherein the voltage-sensing transistor has a second characteristic breakdown voltage, wherein the voltage-sensing transistor has a second geometric layout such that the second characteristic breakdown voltage is determined by a second layout distance of the voltage-sensing transistor, and wherein the voltage-sensing cell is configured to provide a control signal to turn on the first circuit cell when the voltage across the first and second nodes of the voltage-sensing transistor reaches the second characteristic breakdown voltage.

10. The semiconductor device of claim 9, wherein:
    the first geometric layout distance is a first distance between the first and second nodes of the first circuit cell;
    the second geometric layout distance is a second distance between the first and second nodes of the voltage-sensing transistor; and
    the second distance is less than the first distance.

11. A power semiconductor device, comprising:
    a semiconductor substrate, including:
        a first metal-oxide-semiconductor ("MOS") power transistor first cell comprising a source, a drain, and a gate, wherein the first MOS power transistor first cell is fabricated in the substrate to have a first drain-to-source characteristic breakdown voltage determined by a first layout distance between the drain and the source; and
        a MOS transistor second cell comprising a source, a drain connected in common with the first MOS power transistor first cell drain, and a gate connected in common with the first MOS power transistor first cell gate, wherein the MOS transistor second cell has a second drain-to-source characteristic breakdown voltage determined by a second layout distance between the MOS transistor second cell drain and the MOS transistor second cell source, wherein the second layout distance is less than the first layout distance, and wherein the MOS transistor second cell is configured to provide a control signal to turn on the first MOS power transistor first cell when the voltage across the source and drain of the MOS transistor second cell reaches the second drain-to-source characteristic breakdown voltage.

12. The power semiconductor device of claim 11, wherein the semiconductor substrate further comprises a second MOS power transistor first cell, wherein the second MOS power transistor first cell is substantially identical in layout to the first MOS power transistor first cell, wherein the second MOS power transistor first cell has a drain connected in common with the first MOS power transistor first cell drain and the MOS transistor second cell drain, wherein the second MOS power transistor first cell has a gate connected in common with the first MOS power transistor first cell gate and the MOS transistor second cell gate, and wherein the second MOS power transistor first cell has a source connected in common with the first MOS power transistor first cell source.

13. The power semiconductor device of claim 11, wherein the source of the MOS transistor second cell is coupled to a current-limiting device.

14. The power semiconductor device of claim 13, wherein the current-limiting device comprises a resistor.

15. The power semiconductor device of claim 11, wherein the MOS transistor second cell is coupled to a feedback circuit, and wherein the feedback circuit couples the source of the MOS transistor second cell to the gate of the first MOS power transistor first cell.

16. The power semiconductor device of claim 15, wherein the feedback circuit comprises an amplifier circuit.

17. A power semiconductor device, comprising:
a semiconductor substrate, including:
   a power transistor first cell comprising a first terminal, a second terminal, and a control terminal, wherein the power transistor first cell has a first characteristic breakdown voltage between the first and second terminals; and
   a transistor second cell comprising a first terminal connected in common with first terminal of the one power transistor first cell, a second terminal, and a control terminal connected in common with the control terminal of the power transistor first cell, wherein the transistor second cell is designed to have a second characteristic breakdown voltage that is less than the first characteristic breakdown voltage, wherein the transistor second cell is configured to provide a control signal to turn on the power transistor first cell when the voltage across the first and second terminals of the transistor second cell reaches the second characteristic breakdown voltage.

18. An integrated circuit, comprising:
a first transistor including a first terminal and a second terminal, wherein the first transistor has a first breakdown voltage across the first and second terminals, and wherein the first breakdown voltage is determined by a first layout distance between the first and second terminals of the first transistor;
a second transistor coupled across the first and second terminals of the first transistor, wherein the second transistor includes a first terminal and a second terminal, wherein the second transistor has a second breakdown voltage across the first and second terminals of the second transistor, wherein the second breakdown voltage is determined by a second layout distance between the first and second terminals of the second transistor, and wherein the second breakdown voltage is less than the first breakdown voltage; and
a feedback path coupling the first and second transistors, wherein the feedback path is configured to provide a signal from the second transistor to the first transistor to turn on the first transistor when a voltage across the first terminal and the second terminal of the second transistor exceeds the second breakdown voltage.

19. The integrated circuit of claim 18, wherein the first transistor comprises a power field effect transistor ("FET") and the second transistor comprises a voltage-sensing FET.

20. The integrated circuit of claim 19, wherein the first layout distance is greater than the second layout distance.

21. The integrated circuit of claim 18, wherein the feedback path comprises an amplifier circuit.

22. The integrated circuit of claim 18, wherein the first terminal of the first transistor is coupled to the first terminal of the second transistor and the second terminal of the first transistor is coupled to the second terminal of the second transistor.

23. The integrated circuit of claim 18, wherein the first terminal of the first transistor comprises a source finger and the second terminal of the first transistor comprises a drain.

24. The integrated circuit of claim 23, wherein the source finger terminates at a point.

25. The integrated circuit of claim 23, wherein the drain is coupled to a substrate.

26. A method of fabricating a semiconductor device, the method comprising:
   forming a power transistor on a substrate, wherein the power transistor is formed to have a first breakdown voltage determined, at least in part, by a first layout distance between a first terminal and a second terminal of the power transistor;
   forming a voltage-sensing transistor on the substrate, wherein the voltage-sensing transistor is formed to have a second breakdown voltage determined, at least in part, by a second layout distance between a first terminal and a second terminal of the voltage-sensing transistor, and wherein the second breakdown voltage is less than the first breakdown voltage; and
   connecting the voltage-sensing transistor across the first and second terminals of the power transistor such that the power transistor is configured to be turned on by an output provided by the voltage-sensing transistor power transistor when the breakdown voltage of the voltage-sensing transistor is exceeded.

27. The method of claim 26, wherein said connecting the voltage-sensing transistor across the first and second terminals of the power transistor comprises connecting a source of the voltage-sensing transistor to a source of the power transistor and connecting a drain of the voltage-sensing transistor to a drain of the power transistor.

28. The method of claim 27, further comprising connecting a gate of the voltage-sensing transistor to a gate of the power transistor.

29. An integrated circuit, comprising:
   means for determining a first characteristic breakdown voltage across a first terminal and a second terminal of a power transistor; and
   means for determining a second characteristic breakdown voltage of a voltage-sensing transistor coupled across the first and second terminals of the power transistor, wherein the voltage-sensing transistor is configured to provide a control signal to the power transistor to turn on the power transistor when the voltage across the first and second reaches the second characteristic breakdown voltage.

30. The integrated circuit of claim 29, wherein the means for determining a first characteristic breakdown voltage comprises a first geometric layout of the power transistor.

31. The integrated circuit of claim 29, wherein the means for determining a second characteristic breakdown voltage comprises a second geometric layout of the voltage-sensing transistor.

* * * * *

UNITED STATES PATENT AND TRADEMARK OFFICE
CERTIFICATE OF CORRECTION

PATENT NO. : 7,592,677 B2  Page 1 of 1
APPLICATION NO. : 11/484879
DATED : September 22, 2009
INVENTOR(S) : Cave et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 517 days.

Signed and Sealed this

Twenty-first Day of September, 2010

David J. Kappos
*Director of the United States Patent and Trademark Office*